(12) United States Patent
Fertman et al.

(10) Patent No.: US 11,881,577 B2
(45) Date of Patent: Jan. 23, 2024

(54) ACTIVE ELEMENT, HYDROGEN GENERATING APPARATUS, AND ELECTRICAL ENERGY GENERATING APPARATUS

(71) Applicant: 2706649 Ontario Ltd, Aurora (CA)

(72) Inventors: Mark Fertman, Toronto (CA); Gerard Campeau, Newmarket (CA)

(73) Assignee: 2706649 Ontario Ltd, Ontario (CA)

( * ) Notice: Subject to any disclaimer, the term of this patent is extended or adjusted under 35 U.S.C. 154(b) by 520 days.

(21) Appl. No.: 17/107,412

(22) Filed: Nov. 30, 2020

(65) Prior Publication Data

US 2021/0167450 A1    Jun. 3, 2021

(30) Foreign Application Priority Data

Nov. 28, 2019 (EP) .................................... 19212000

(51) Int. Cl.
| | |
|---|---|
| *H01M 16/00* | (2006.01) |
| *H01M 4/36* | (2006.01) |
| *H01M 4/58* | (2010.01) |
| *C25B 1/04* | (2021.01) |
| *C25B 11/052* | (2021.01) |
| *C25B 11/061* | (2021.01) |
| *C25B 11/075* | (2021.01) |
| *H01L 35/30* | (2006.01) |

(Continued)

(52) U.S. Cl.
CPC .............. *H01M 16/00* (2013.01); *C25B 1/04* (2013.01); *C25B 11/052* (2021.01); *C25B 11/061* (2021.01); *C25B 11/075* (2021.01); *H01M 4/366* (2013.01); *H01M 4/58* (2013.01); *H10N 10/13* (2023.02); *H01M 2004/028* (2013.01)

(58) Field of Classification Search
None
See application file for complete search history.

(56) References Cited

U.S. PATENT DOCUMENTS

| | | | |
|---|---|---|---|
| 3,131,664 A | 5/1964 | McInvale | |
| 3,674,447 A | 7/1972 | Bellis | |

(Continued)

FOREIGN PATENT DOCUMENTS

| | | |
|---|---|---|
| CN | 108528712 A | 9/2018 |
| CN | 108688785 A | 10/2018 |

(Continued)

OTHER PUBLICATIONS

European Patent Office, Extended European Search Report pursuant to Rule 62 EPC, dated Dec. 15, 2020 in Patent Application No. 19212000.4, which is a foreign counterpart to this U.S. Application.

(Continued)

*Primary Examiner* — Christopher P Domone
(74) *Attorney, Agent, or Firm* — Kolitch Romano Dascenzo Gates LLC (57) ABSTRACT

An active element for an electrochemical apparatus or an electrical energy generating apparatus may include a plane or curved, generally plate-type, sheet-type or mesh-type support body. A surface of the support body is at least partly (preferably entirely) coated with amorphous nickel boron or nickel thallium boron or a similar amorphous, columnar growth boron containing coating having a nodular topography.

18 Claims, 5 Drawing Sheets

(51) Int. Cl.
  *H10N 10/13*      (2023.01)
  *H01M 4/02*       (2006.01)

(56) References Cited

U.S. PATENT DOCUMENTS

| | | | |
|---|---|---|---|
| 3,942,511 A | | 3/1976 | Black et al. |
| 5,256,501 A | | 10/1993 | Hasvold et al. |
| 5,285,798 A | | 2/1994 | Banerjee et al. |
| 6,066,406 A | * | 5/2000 | McComas ............... C23C 18/34 |
| | | | 428/936 |
| 6,834,623 B2 | | 12/2004 | Cheng |
| 8,974,927 B2 | | 3/2015 | Fertman |
| 2006/0024447 A1 | | 2/2006 | McComas |
| 2006/0251910 A1 | | 11/2006 | Lancsek |
| 2007/0059584 A1 | * | 3/2007 | Nakano ............... H01M 4/134 |
| | | | 204/290.01 |
| 2008/0170327 A1 | | 7/2008 | Machida |
| 2008/0274671 A1 | | 11/2008 | ODonoghue et al. |
| 2009/0011297 A1 | | 1/2009 | Jang et al. |
| 2009/0075156 A1 | | 3/2009 | Long et al. |
| 2009/0123777 A1 | * | 5/2009 | McComas ............... C23C 18/32 |
| | | | 427/256 |
| 2009/0280054 A1 | | 11/2009 | Parker et al. |
| 2012/0301751 A1 | | 11/2012 | Fertman |
| 2017/0149036 A1 | * | 5/2017 | Braun .................... C21D 6/008 |
| 2018/0057944 A1 | | 3/2018 | Mohammadian |
| 2020/0036002 A1 | | 1/2020 | Chakraborty et al. |

FOREIGN PATENT DOCUMENTS

| | | | |
|---|---|---|---|
| EP | 2528145 | A1 | 11/2012 |
| EP | 2706608 | A1 | 3/2014 |
| EP | 2830135 | A1 | 1/2015 |
| WO | 8707311 | A1 | 12/1987 |
| WO | 2017004777 | A1 | 1/2017 |
| WO | 2018081904 | A1 | 5/2018 |

OTHER PUBLICATIONS

European Patent Office, Extended European Search Report pursuant to Rule 62 EPC, dated Nov. 6, 2020 in Patent Application No. 19212000.4, which is a foreign counterpart to this U.S. Application.
European Patent Office, Communication Pursuant to Article 94(3) EPC, dated May 19, 2020 in Patent Application No. EP19214329.5.
European Patent Office, Communication Pursuant to Article 94(3) EPC, dated Jul. 22, 2020 in Patent Application No. EP20158224.4.
European Patent Office, Communication Pursuant to Article 94(3) EPC, dated Nov. 13, 2020 in Patent Application No. EP20177412.
"FCair—The Complete Hydrogen Solution for Commercial UAVs"; obtained at https://info.ballard.com/informational-complete-hydrogen-uav-solution; Dec. 2020.
"Submarines—ThyssenKrupp Marine Systems"; obtained at https://www.thyssenkrupp-marinesystems.com/en/products-services/submarines; Dec. 2020.
"Pioneers in the submarine market"; obtained at https://www.siemens-energy.com/global/en/offerings/industrial-applications/marine/submarines.html; Dec. 2020.
European Patent Office, Communication Pursuant to Article 94(3) EPC, dated Jan. 29, 2021 in Patent Application No. EP20192053.
European Patent Office, Communication Pursuant to Article 94(3) EPC, dated Feb. 15, 2021 in Patent Application No. EP20177412.
Khrussanova, M. et al.; "Hydriding of Mechanically Alloyed Mixtures of Magnesium with MnO2, Fe2O3 and NiO"; downloaded on Aug. 23, 2021 at https://www.sciencedirect.com/science/article/abs/pii/0025540891900987; Jul. 1991.
Wang, Jiasheng, et al.; "Effects of Fe Modified Na2WO4 Additive on the Hydrogen Storage Properties of MgH2"; downloaded Aug. 23, 2021 at https://link.springer.com/article/10.1007/s11595-019-2155-2?utm_source=xmol&utm_medium=affiliate&utm_content=meta&utm_campaign=DDCN_1_GL01_metadata; Oct. 2019.
Zhang, Peili, et al.; "Electroless plated Ni-Bx films as highly active electrocatalysts for hydrogen production from water over a wide pH range," Nano Energy, vol. 19, pp. 98-107, Jan. 2016.

* cited by examiner

ACTIVE ELEMENT, HYDROGEN GENERATING APPARATUS, AND ELECTRICAL ENERGY GENERATING APPARATUS

FIELD

This disclosure relates to systems and methods for hydrogen generation and electrical energy generation devices. More specifically, the disclosed embodiments relate to active elements utilized in such devices.

SUMMARY

The present disclosure provides systems, apparatuses, and methods relating to active elements in a hydrogen generating apparatus or an electrical energy generating apparatus.

In some embodiments, an active element of an electrochemical apparatus or an electrical energy generating apparatus may include: a planar or curved, generally plate-type, sheet-type or mesh-type support body, a surface of which is at least partly, preferably entirely, coated with an amorphous nickel boron or nickel thallium boron, or a similar amorphous, columnar growth boron-containing coating having a nodular topography.

In some embodiments, the active element is adapted as a catalyzer element in a hydrogen generator apparatus, and a hydrogen generator apparatus may include a vessel having a gas outlet; at least one hydrogen-developing element which is made from or at least comprises portions made from magnesium, magnesite, manganese, zinc, aluminum, or an alloy of magnesium, magnesite, manganese, zinc, or aluminum, preferably a plurality of such hydrogen-developing elements; the catalyzer element; and an alkaline or saline aqueous electrolyte comprising potassium hydroxide, potassium chloride, or a manganese compound; wherein the at least one hydrogen-developing element, the catalyzer element, and the electrolyte are all disposed in the vessel.

In some embodiments, a combined hydrogen generator apparatus and electrical energy generating apparatus may include: the hydrogen generator apparatus above, comprising a plurality of the catalyzer elements and a plurality of the hydrogen-developing elements; a cathode element and an anode element arranged within the vessel proximate to end surfaces thereof, such that the hydrogen-developing elements and the catalyzer elements are arranged between the cathode and the anode elements; and a switch configured to selectively short the cathode element with the anode element or re-separate the shorted cathode element and anode element, to switch between a hydrogen generating operation and an electrical energy generating operation of the apparatus.

In some embodiments, an electrical energy generating apparatus, in particular an electrical battery, may include the active element as a cathode.

In some embodiments, the active element is adapted as a current generating element in a thermoelectric generator apparatus.

In some embodiments, a thermoelectric generator apparatus may include: the active element adapted as a current generating element; and at least one electrode plate arranged opposite to the coated surface of the active element, preferable two electrode plates, sandwiching the active element between them.

Features, functions, and advantages may be achieved independently in various embodiments of the present disclosure, or may be combined in yet other embodiments, further details of which can be seen with reference to the following description and drawings.

DETAILED DESCRIPTION

Various aspects and examples of active elements in hydrogen generating devices and/or electrical energy generating devices, as well as related systems and methods, are described below and illustrated in the associated drawings. Unless otherwise specified, an active element, hydrogen generating device, and/or electrical energy generating device in accordance with the present teachings, and/or its various components, may contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

Definitions

The following definitions apply herein, unless otherwise indicated.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"AKA" means "also known as," and may be used to indicate an alternative or corresponding term for a given element or elements.

"Providing," in the context of a method, may include receiving, obtaining, purchasing, manufacturing, generating, processing, preprocessing, and/or the like, such that the object or material provided is in a state and configuration for other steps to be carried out.

In this disclosure, one or more publications, patents, and/or patent applications may be incorporated by reference. However, such material is only incorporated to the extent that no conflict exists between the incorporated material and the statements and drawings set forth herein. In the event of any such conflict, including any conflict in terminology, the present disclosure is controlling.

Examples, Components, and Alternatives

The following describes selected aspects of illustrative active elements in hydrogen generating devices or electrical energy generating devices, as well as related systems and/or methods. The examples are intended for illustration and should not be interpreted as limiting the scope of the present disclosure. One or more distinct embodiments or examples, and/or contextual or related information, function, and/or structure may be included.

The present disclosure relates to an active element in a hydrogen generating apparatus or an electrical energy generating apparatus. Furthermore, the invention relates to a hydrogen generating apparatus which contains such an active element, and still further to an electrical energy generating apparatus which comprises such an active element.

It is well known that the function and efficiency of electrochemical apparatuses, including electrochemical hydrogen generating apparatuses, and of many types of electrical energy generating apparatuses can be significantly improved by using appropriate materials for the major components thereof, in particular of components which hereinbelow are referred to as "active elements" or "active materials". These are, in particular, cathode elements of an electrochemical apparatus, including an electrochemical battery, catalyzer elements in electrochemical apparatus, including hydrogen generating apparatus, and/or thermoelectrically effective layers in a thermoelectric generator apparatus.

Developing and using materials of superior efficiency in such devices can result in significantly improved efficiency thereof, which may well open new applications and vastly broader markets for them.

For example, the usage of Halb-Heusler compounds in thermoelectrical modules has, at least in principle, made such modules applicable for use as electrical energy generators, rather than just for the well-known purposes of measuring temperatures or heating small objects.

Nickel thallium boron or nickel boron are materials which have been produced for decades in generations of production processes, as disclosed in various patents (e.g., U.S. Pat. Nos. 3,674,447, 5,019,163, 6,183,546, or U.S. Pat. No. 6,066,406). Nickel boron coatings on metallic parts are columnar in growth, resulting in distinct nodular topography which serves to reduce surface-to-surface contact of two mating/sliding surfaces. This results in a significant reduction of drag/friction. Moreover, the nodular structure dissipates heat at a greater efficiency due to the greater surface area. These effects have led to widespread usage of such coatings in the fields of tooling, ship propellers, crude oil pumping equipment, bushings, weapons, automotive and truck transmissions, etc.

The inventors found that, beyond and far away from the above-referenced effects and corresponding applications, nickel boron or nickel thallium boron coatings with an amorphous, columnar growth and having a nodular topography, can heavily improve the efficiency of active elements of electrochemical devices or electrical energy generating devices, in particular of cathodes and/or catalyzer bodies of such devices.

In some embodiments, the coating comprises 1.5 wt. % to 20 wt. % (e.g., between 1.5 wt. % and 20 wt. %), preferably between 2 wt. % and 10 wt. %, of boron. As used herein, the term "wt. %" means percent (or percentage) by weight. According to the peculiarities of specific applications, different values can be appropriate.

In some embodiments, the coating has a thickness of 20 µm to 500 µm (e.g., between 20 µm and 500 µm), preferably 50 µm to 200 µm. This thickness may refer to a range of actual thickness values, a median thickness, or an average thickness. According to the peculiarities of specific applications, different values can be appropriate.

In some embodiments, the coating is of the type produced by alkaline electroless coating, and can be produced basically in line with the processes disclosed in the above-referenced US patents.

In some embodiments, the support body is made of steel, titanium or a titanium alloy, aluminum or an aluminum alloy, copper or a copper alloy, or magnesium or a magnesium alloy. Support bodies from other materials, or a composite body of the materials referenced herein, or with additional materials, can be used in specific fields and for specific purposes.

In some embodiments, the active element comprises an overall flat, cylindrical, or spiral plate or sheet shape. Other geometrical shapes, e.g. small balls arranged in a plate-type holder, or appropriately supported filaments, can be useful embodiments in specific fields and for specific purposes.

In some electrochemical apparatus embodiments, a highly efficient hydrogen generator apparatus comprises: a vessel having a gas outlet, at least one hydrogen-developing element which is made from or at least comprises portions made from magnesium or magnesite, manganese, zinc, or aluminum, or an alloy of magnesium, magnesite, manganese, zinc, or aluminum, preferably a plurality of such hydrogen-developing elements, a catalyzer element, and an alkaline or saline aqueous electrolyte, in particular comprising potassium hydroxide or potassium chloride or a manganese compound, all arranged in the vessel.

Regarding the electrolyte, the inventors found that an electrolyte comprising potassium hydroxide or potassium chloride may be superior over natrium based electrolytes, in terms of the yield of hydrogen generation.

In an embodiment of such a hydrogen generator apparatus, a first plurality of plate-shaped or cylindrical hydrogen-developing elements and a second plurality of correspondingly plate-shaped or cylindrical catalyzer elements is arranged in the vessel in an alternating configuration of the respective active surfaces of the hydrogen-developing element and the catalyzer element embedded in the electrolyte.

In a further embodiment of such apparatus, a meander-shaped or comb-shaped or spiral-shaped hydrogen-developing element and a corresponding comb-shaped or meander-shaped or spiral-shaped catalyzer element are arranged in the vessel in an interdigitated or coaxially spiral configuration such that the active surfaces of the hydrogen-developing element and the catalyzer element alternate with each other.

In further embodiments of such apparatus, the catalyzer element or catalyzer elements, respectively and the hydrogen-developing element or hydrogen-developing elements, respectively, are arranged such that the active surfaces thereof are opposed to each other and are at a predetermined distance, preferably 1 to 10 mm (e.g., between 1 and 10 mm), and more preferably between 3 and 5 mm. According to the peculiarities of specific applications, different values can be appropriate.

In a further embodiment, each catalyzer element and each hydrogen-generating element are integrally formed as a plane or curved plate-type element, one surface of which is coated to act as the catalyzer element and the opposing surface is a hydrogen-developing surface. More specifically, the plate-type support body can be basically made from magnesium, manganese, zinc, or aluminum or an alloy of magnesium, manganese, zinc, or aluminum, and provides the hydrogen-developing surface. As a further option, such integrated catalyzer/hydrogen-generating element can comprise a support plate or mesh made e.g. from steel, which on its one surface is coated with a hydrogen-generating material and on its other surface with nickel boron or nickel thallium boron.

Beyond the above-referenced aspects of embodiments of the invention, the inventors have found that even basically unprocessed magnesite might be used to form the support body of the active element and/or a hydrogen-developing body in a hydrogen developing apparatus. The use of such mineral, without further processing, might further reduce the cost of such an element or apparatus.

Besides this, and independent from that latter aspect, the inventors found that manganese or manganese alloys and compounds may advantageously be used for implementing the present invention, both regarding the active element as such and regarding further components of a hydrogen generating apparatus or electrical battery, in particular in an electrolyte or in an electrode body or hydrogen-developing body.

The mineral is crushed and formed into a plate or rod or any other usable shape using a suitable binder or combination of binders, to provide a low-cost hydrogen-developing body for utility scale application. This further reduces the cost of the hydrogen production process.

Generally, the vessel of the hydrogen generator apparatus can be made from any suitable plastic, which reliably withstands the electrolyte contained in the vessel, e.g. acrylonitrile butadiene styrene (ABS) or polyamide (PA), and can have any appropriate geometrical shape, e.g. cubic, cylindrical or other, possibly adapted to restraints of a mounting space, e.g. in a car, ship, boat, airplane, or drone. Furthermore, the vessel can be made from any suitable metal, e.g. steel or aluminum, preferably provided with an internal protective plastic coating.

In a multi-purpose configuration, the hydrogen generator apparatus can be adapted for additionally producing steam, wherein the hydrogen-developing element or hydrogen-developing elements and catalyzer element or catalyzer elements is/are arranged in a hermetically closed reactor vessel. The reactor vessel includes a water inlet, a hydrogen outlet, and a steam outlet. A control mechanism is provided for controlling the intake of the water or electrolyte and the output of steam produced in the reactor body, in an exothermal reaction at the electrolyte-contacting surfaces of the hydrogen-developing element or elements. The control mechanism in particular may include a start/stop mechanism for starting or stopping the hydrogen production and steam generation.

In another multi-purpose configuration, the hydrogen generator apparatus can be combined with an electrical energy generating apparatus. In such examples, the device may include a hydrogen generator apparatus as specified further above, specifically comprising a plurality of catalyzer elements and a plurality of hydrogen-developing elements, a cathode element and an anode element arranged within the vessel proximate to end surfaces thereof, such that the pluralities of hydrogen generating elements and catalyzer elements are arranged between the cathode and the anode elements. A switch mechanism is provided, the switch mechanism being configured to selectively short the cathode element with the anode element or re-separate the shorted cathode element and anode element, to switch between hydrogen generating operation and electrical energy generating operation of the apparatus.

Besides a hydrogen generating apparatus and a combined hydrogen generator and electrical energy generating apparatus, as mentioned above, the present disclosure refers to a stand-alone electrical energy generating apparatus, in particular an electrical battery of any type wherein an active element of the present disclosure serves as a cathode.

Still further, the present disclosure refers to an active element which is adapted as a current generating element in at thermoelectric generator apparatus, and to a thermoelectric generator apparatus, comprising such electric element and at least one electrode plate arranged opposite to the coated surface of the active element, preferable two electrode plates, sandwiching the active element between them.

Figure 1A:
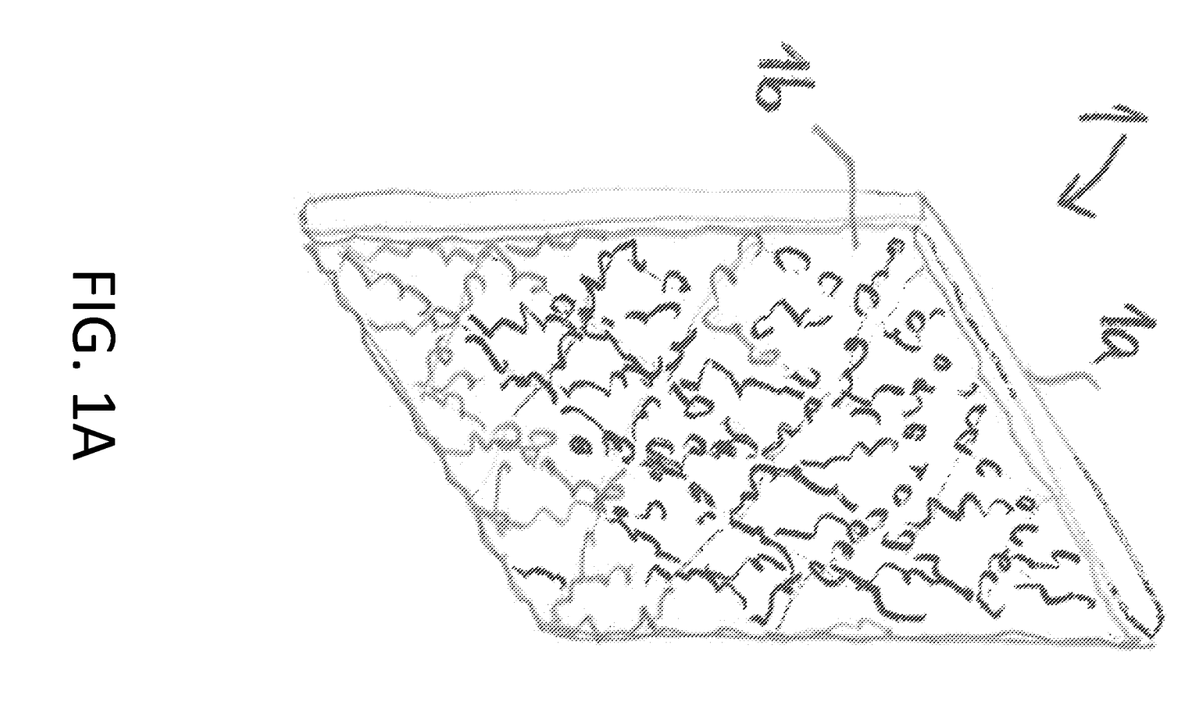
FIG. 1A is a schematic diagram of an illustrative plate-shaped active element suitable for use in an electrochemical apparatus or an electrical energy generating apparatus.
Figure 1B:
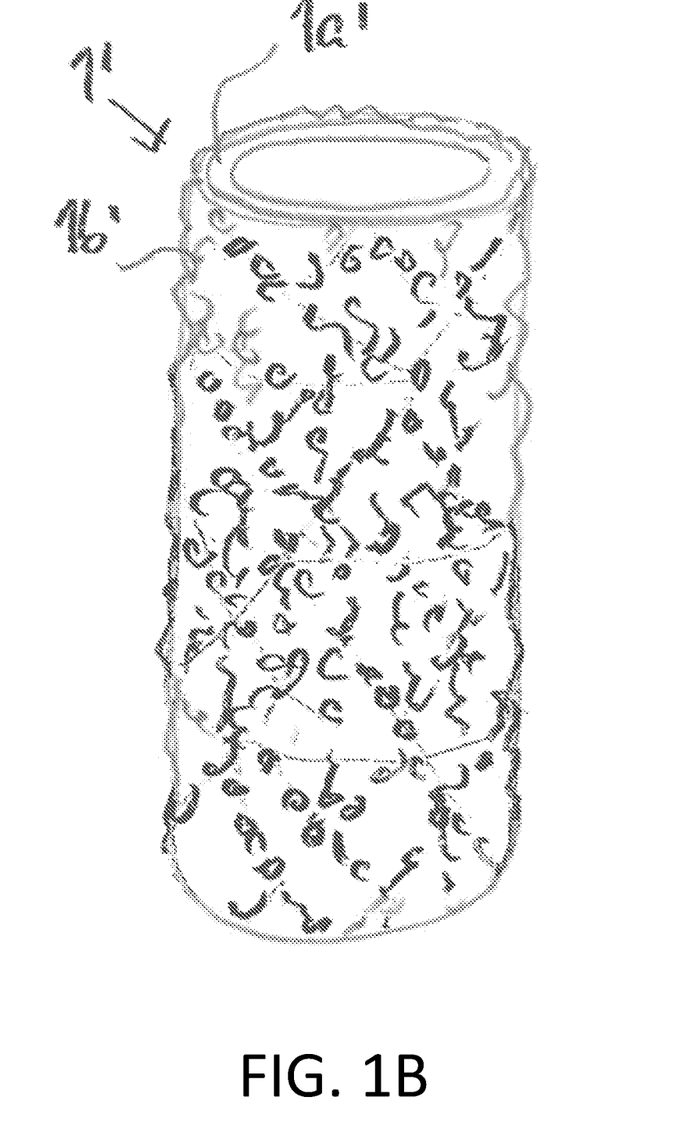
FIG. 1B is a schematic diagram of an illustrative cylindrical or cylinder-shaped active element suitable for use in an electrochemical apparatus or an electrical energy generating apparatus.
Figure 1C:
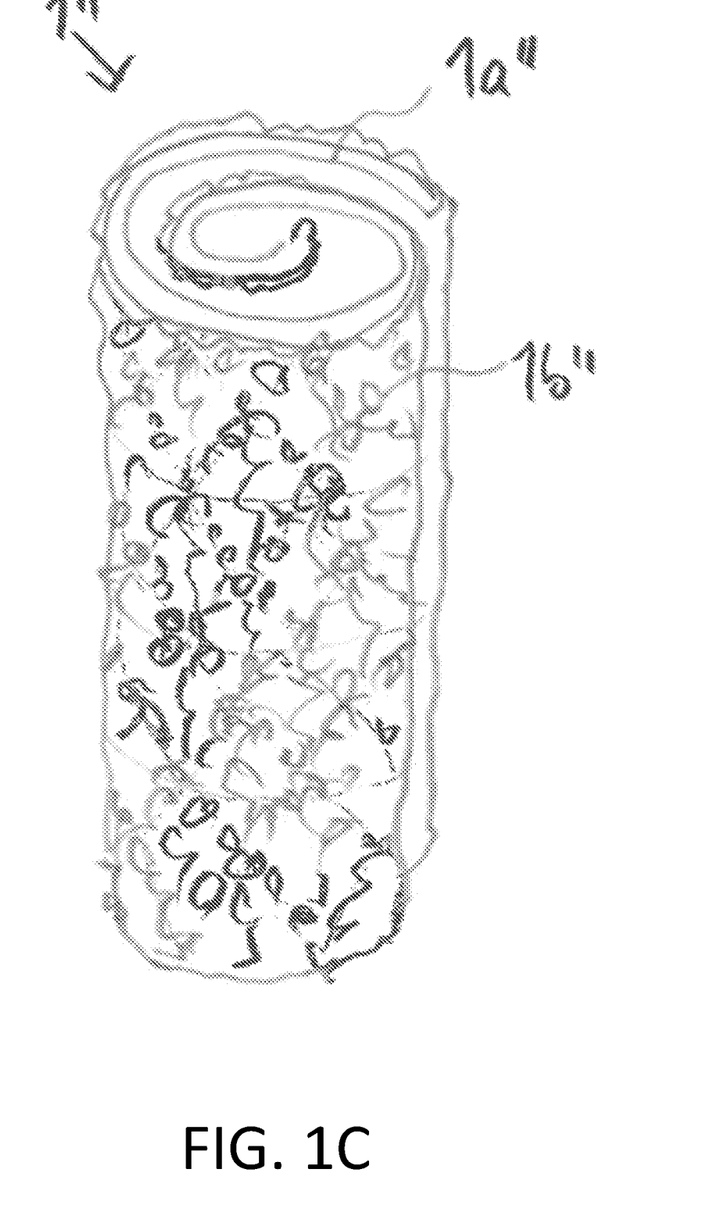
FIG. 1C is a schematic diagram of an illustrative spiral sheet shaped active element suitable for use in an electrochemical apparatus or an electrical energy generating apparatus.

Turning now to the drawings, FIGS. 1A through 1C schematically illustrate an active element of an electrochemical apparatus or an electrical energy generating apparatus in three different shapes, i.e. plate-shaped (FIG. 1A), cylindrical shape (FIG. 1B) and spiral sheet shape (FIG. 1C), respectively.

With reference to FIG. 1A, a first active element 1 has a planar, plate-type support body 1*a*, which is made, e.g., of magnesium or magnesium alloy, and which has an amorphous, columnar growth boron-containing coating 1*b* with a nodular topology or topography.

FIG. 1B shows a similar second active element 1', a support body 1*a'* of which can be made of manganese or manganese alloy, titanium or a titanium alloy, or aluminum or an aluminum alloy, and which has an amorphous nickel boron or nickel thallium boron coating 1*b'* with a median thickness of 50 μm to 200 μm.

FIG. 1C depicts a third active element 1" of an apparatus of the above-specified function, which element has a spiral sheet shape configuration and which comprises a support sheet 1*a"* made, e.g., from copper or steel, and which has a columnar growth boron-containing coating 1*b"*.

Figure 2:
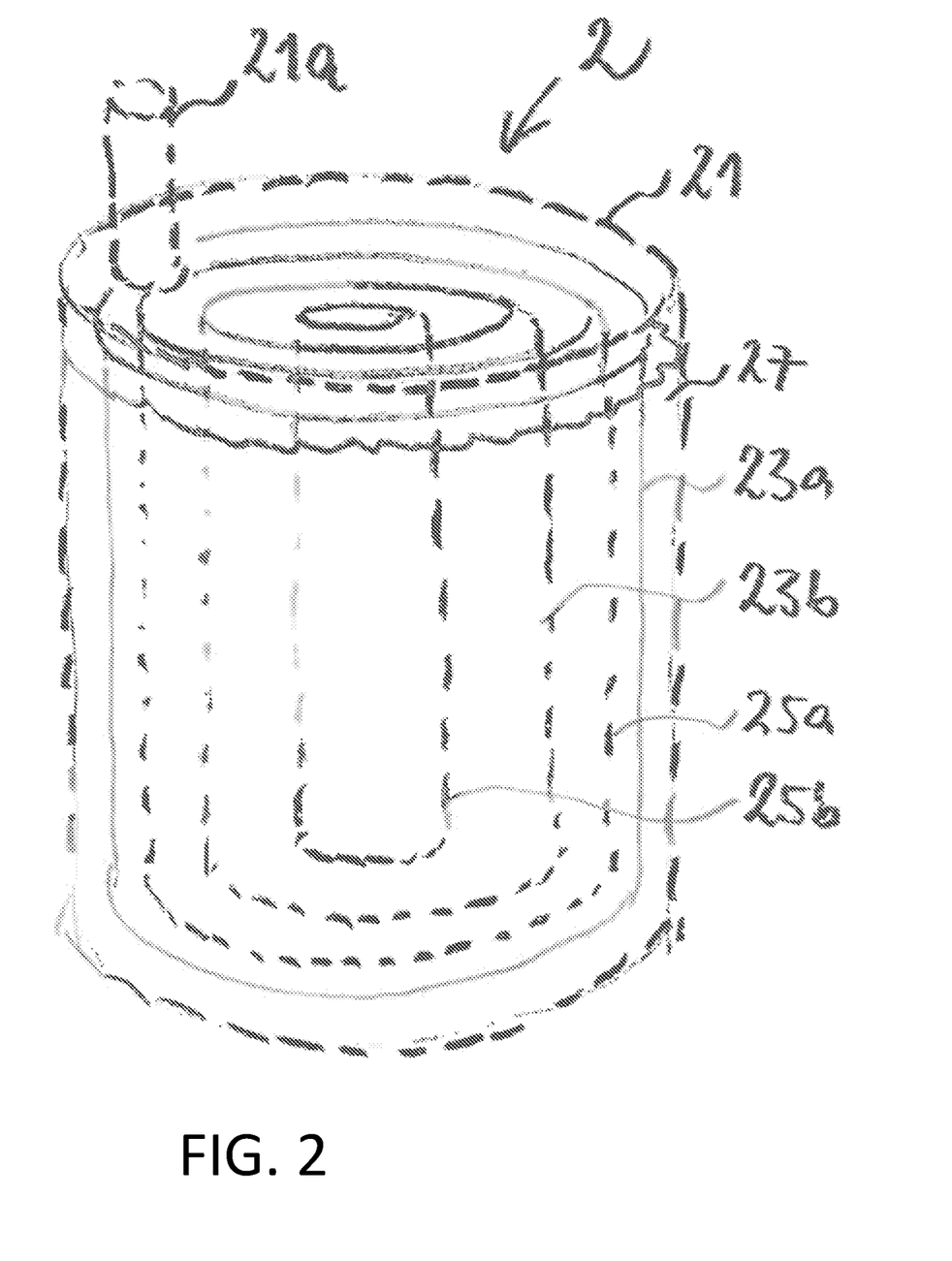
FIG. 2 shows an illustrative hydrogen generator apparatus including active elements of the type shown in FIG. 1B.

FIG. 2 shows an illustrative hydrogen generator apparatus 2 which includes active elements of the type shown in FIG. 1B.

Apparatus 2 includes a cylindrical vessel 21 having a gas outlet 21*a* for hydrogen generated therein, and a cylindrical configuration of two hydrogen-generating elements 23*a*, 23*b* made, e.g., from magnesium or magnesite, and two active elements 25*a*, 25*b* of the above-explained type, acting as catalyzer elements for the hydrogen generation, arranged in an alternating coaxial configuration. All the hydrogen generating elements and catalyzer elements are immersed into an alkaline or saline aqueous electrolyte 27, which may, for example, comprise potassium hydroxide or potassium chloride.

Figure 3:
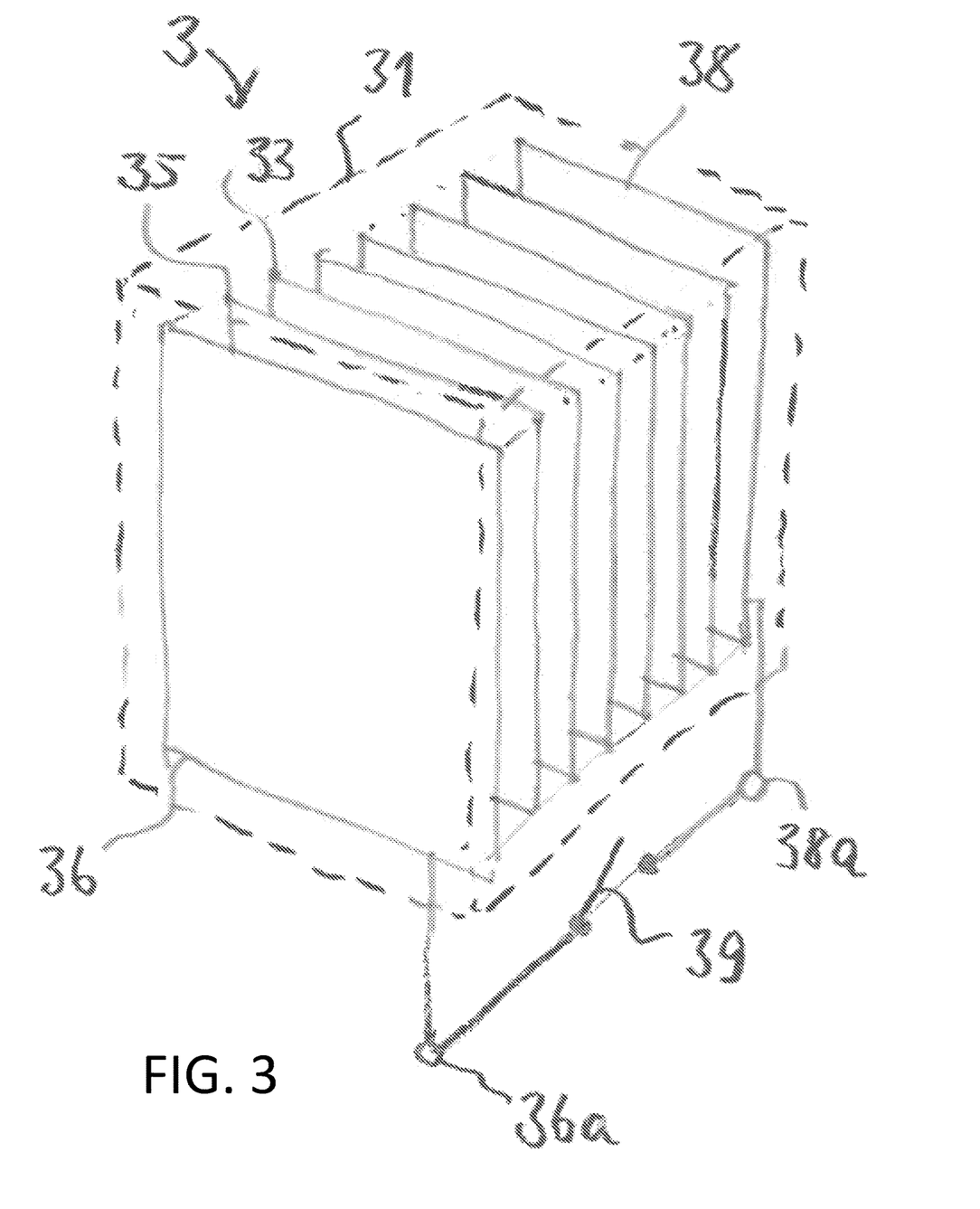
FIG. 3 is a schematic diagram of an illustrative combined hydrogen generator and electrical energy generating apparatus of the present disclosure, having a generally cuboid shape.

FIG. 3 is a schematic diagram of a combined hydrogen generator and electrical energy generating apparatus 3 of a generally cuboid shape.

Arranged in a plastic vessel 31, apparatus 3 comprises an alternating configuration of plural planar plate-shaped hydrogen generating elements 33 and catalyzer elements 35 in an alternating configuration between an end surface cathode element 36 and an opposing end surface anode element 38. Cathode element 36 has an electrical connection 36a, and anode element 38 has an electrical connection 38a. Both connections 36a, 38a can be short-circuited by a switch 39. The vessel is filled with an electrolyte (not shown).

Illustrative Combinations and Additional Examples

This section describes additional aspects and features of active elements in hydrogen generating devices or electrical energy generating devices, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. An active element of an electrochemical apparatus or an electrical energy generating apparatus, the active element comprising:
a planar or curved, generally plate-type, sheet-type or mesh-type support body, a surface of which is at least partly, preferably entirely, coated with an amorphous nickel boron or nickel thallium boron, or a similar amorphous, columnar growth boron-containing coating having a nodular topography.

A1. The active element of A0, wherein the coating comprises between 1.5 wt. % and 20 wt. %, preferably between 2 wt. % and 10 wt. %, of boron.

A2. The active element of A0 or A1, wherein the coating has a median thickness between 20 μm and 500 μm, preferably between 50 μm and 200 μm.

A3. The active element of any one of paragraphs A0 through A2, wherein the coating is of the type produced by alkaline electroless coating.

A4. The active element of any one of paragraphs A0 through A3, wherein the support body is made of steel, magnesium, a magnesium alloy, magnesite, manganese, a manganese alloy, titanium, a titanium alloy, aluminum, an aluminum alloy, copper, or a copper alloy.

A5. The active element of any one of paragraphs A0 through A4, wherein the active element is adapted as a catalyzer element in a hydrogen generator apparatus and/or as a cathode element in a battery cell.

A6. The active element of A5, comprising an overall flat, cylindrical, or spiral plate or sheet shape.

A7. A hydrogen generator apparatus comprising
a vessel having a gas outlet;
at least one hydrogen-developing element which is made from or at least comprises portions made from magnesium, magnesite, manganese, zinc, aluminum, or an alloy of magnesium, magnesite, manganese, zinc, or aluminum, preferably a plurality of such hydrogen-developing elements;
the catalyzer element of A5 or A6; and
an alkaline or saline aqueous electrolyte comprising potassium hydroxide, potassium chloride, or a manganese compound;
wherein the at least one hydrogen-developing element, the catalyzer element, and the electrolyte are all disposed in the vessel.

A8. The hydrogen generator apparatus of A7, wherein a first plurality of plate-shaped or cylindrical ones of the hydrogen-developing elements and a second plurality of correspondingly plate-shaped or cylindrical ones of the catalyzer elements are arranged in the vessel in an alternating configuration of respective active surfaces of the hydrogen-developing elements and the catalyzer elements embedded in the electrolyte.

A9. The hydrogen generator apparatus of A7 or A8, wherein a meander-shaped or comb-shaped or spiral-shaped one of the hydrogen-developing elements and a corresponding comb-shaped or meander-shaped or spiral-shaped one of the catalyzer elements are arranged in the vessel in an interdigitated or coaxially spiral configuration, such that active surfaces of the hydrogen-developing elements and the catalyzer elements alternate with each other.

A10. The hydrogen generator apparatus of A7, A8, or A9, wherein the catalyzer element and the at least one hydrogen-developing element are arranged such that active surfaces thereof are opposed to each other and are at a predetermined distance, preferably measuring between 1 and 10 mm and more preferably between 3 and 5 mm.

A11. The hydrogen generator apparatus of any one of paragraphs A7 through A10, wherein the catalyzer element and each of the at least one hydrogen-developing element are integrally formed as a plane or curved plate-type element, one surface of which is coated to act as the catalyzer element and an opposing surface of which is a hydrogen-developing surface.

A12. The hydrogen generator apparatus of A11, wherein the support body is a plate comprising magnesium, manganese, zinc, aluminum, or an alloy or compound of magnesium, manganese, zinc, or aluminum, and provides the hydrogen-developing surface.

A13. The hydrogen generator apparatus of any one of paragraphs A7 through A12, wherein the hydrogen generator apparatus is further configured to produce steam;
wherein the at least one hydrogen-developing element and the catalyzer element are arranged in a hermetically closed reactor vessel, the reactor vessel comprising a water inlet, a hydrogen outlet, a steam outlet, and a control device configured to control an intake of water or electrolyte and an output of steam produced in the reactor vessel in an exothermic reaction at electrolyte-contacting surfaces of the at least one hydrogen-developing element,
wherein the control device comprises a start/stop mechanism configured to selectively start or stop the hydrogen production and steam generation.

B0. A combined hydrogen generator apparatus and electrical energy generating apparatus, comprising:
a hydrogen generator apparatus of any one of paragraphs A7 through A13, comprising a plurality of the catalyzer elements and a plurality of the hydrogen-developing elements;
a cathode element and an anode element arranged within the vessel proximate to end surfaces thereof, such that the hydrogen-developing elements and the catalyzer elements are arranged between the cathode and the anode elements; and
a switch configured to selectively short the cathode element with the anode element or re-separate the shorted cathode element and anode element, to switch between a hydrogen generating operation and an electrical energy generating operation of the apparatus.

C0. An electrical energy generating apparatus, in particular an electrical battery comprising the active element of any one of paragraphs A0 through A4 as a cathode.

D0. The active element of any one of paragraphs A0 through A4, wherein the active element is adapted as a current generating element in a thermoelectric generator apparatus.

E0. A thermoelectric generator apparatus, comprising:
the active element of D0; and
at least one electrode plate arranged opposite to the coated surface of the active element, preferable two electrode plates, sandwiching the active element between them.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

The invention claimed is:

1. An active element of an electrochemical apparatus or an electrical energy generating apparatus, the active element comprising:
a planar or curved support body comprising steel, a surface of which is at least partly coated with an amorphous, columnar growth boron-containing coating having a nodular topography;
wherein the coating comprises 1.5 wt. % to 20 wt. % of boron.

2. The active element of claim 1, wherein the coating has a median thickness of 20 μm to 500 μm.

3. The active element of claim 1, wherein the coating is of a type produced by alkaline electroless coating.

4. An electrical battery comprising the active element of claim 1 as a cathode.

5. The active element of claim 1, wherein the active element is adapted as a current generating element in a thermoelectric generator apparatus.

6. A thermoelectric generator apparatus, comprising:
the active element of claim 5; and
two electrode plates sandwiching the active element between them.

7. The active element of claim 1, wherein the support body is generally plate-type, sheet-type, or mesh-type.

8. The active element of claim 1, wherein the coating comprises an amorphous nickel boron or nickel thallium boron.

9. The active element of claim 1, wherein the active element is adapted as a catalyzer element in a hydrogen generator apparatus or as a cathode element in a battery cell.

10. The active element of claim 9, comprising an overall flat, cylindrical, or spiral plate or sheet shape.

11. A hydrogen generator apparatus comprising
a vessel having a gas outlet;
at least one hydrogen-developing element comprising magnesium, magnesite, manganese, zinc, aluminum, or an alloy of magnesium, magnesite, manganese, zinc, or aluminum;
the catalyzer element of claim 9; and
an alkaline or saline aqueous electrolyte comprising potassium hydroxide, potassium chloride, or a manganese compound;
wherein the at least one hydrogen-developing element, the catalyzer element, and the electrolyte are all disposed in the vessel.

12. The hydrogen generator apparatus of claim 11, wherein a first plurality of plate-shaped or cylindrical ones of the hydrogen-developing elements and a second plurality of correspondingly plate-shaped or cylindrical ones of the catalyzer elements are arranged in the vessel in an alternating configuration of respective active surfaces of the hydrogen-developing elements and the catalyzer elements embedded in the electrolyte.

13. The hydrogen generator apparatus of claim 11, wherein a meander-shaped or comb-shaped or spiral-shaped one of the hydrogen-developing elements and a corresponding comb-shaped or meander-shaped or spiral-shaped one of the catalyzer elements are arranged in the vessel in an interdigitated or coaxially spiral configuration, such that active surfaces of the hydrogen-developing elements and the catalyzer elements alternate with each other.

14. The hydrogen generator apparatus of claim 11, wherein the catalyzer element and the at least one hydrogen-developing element are arranged such that active surfaces thereof are opposed to each other and are at a predetermined distance measuring between 1 and 10 mm.

15. The hydrogen generator apparatus of claim 11, wherein the catalyzer element and each of the at least one hydrogen-developing element are integrally formed as a plane or curved plate-type element, one surface of which is coated to act as the catalyzer element and an opposing surface of which is a hydrogen-developing surface.

16. The hydrogen generator apparatus of claim 15, wherein the support body is a plate configured to provide the hydrogen-developing surface.

17. The hydrogen generator apparatus of claim 11, wherein the hydrogen generator apparatus is further configured to produce steam;
wherein the at least one hydrogen-developing element and the catalyzer element are arranged in a closed reactor vessel, the reactor vessel comprising a water inlet, a hydrogen outlet, a steam outlet, and a control device configured to control an intake of water or electrolyte and an output of steam produced in the reactor vessel in an exothermic reaction at electrolyte-contacting surfaces of the at least one hydrogen-developing element,
wherein the control device comprises a start/stop mechanism configured to selectively start or stop the hydrogen production and steam generation.

18. A combined hydrogen generator apparatus and electrical energy generating apparatus, comprising:
a hydrogen generator apparatus of claim 11, comprising a plurality of the catalyzer elements and a plurality of the hydrogen-developing elements;
a cathode element and an anode element arranged within the vessel proximate to end surfaces thereof, such that the hydrogen-developing elements and the catalyzer elements are arranged between the cathode and the anode elements; and a switch configured to selectively short the cathode element with the anode element or re-separate the shorted cathode element and anode element, to switch between a hydrogen generating operation and an electrical energy generating operation of the apparatus.

* * * * *